US009455621B2

(12) United States Patent
Lund et al.

(10) Patent No.: US 9,455,621 B2
(45) Date of Patent: Sep. 27, 2016

(54) CONTROLLER IC WITH ZERO-CROSSING DETECTOR AND CAPACITOR DISCHARGE SWITCHING ELEMENT

(71) Applicant: Power Integrations, Inc., San Jose, CA (US)

(72) Inventors: Leif Lund, San Jose, CA (US); David Kung, Foster City, CA (US)

(73) Assignee: Power Integrations, Inc., San Jose, CA (US)

( * ) Notice: Subject to any disclaimer, the term of this patent is extended or adjusted under 35 U.S.C. 154(b) by 572 days.

(21) Appl. No.: 14/012,579

(22) Filed: Aug. 28, 2013

(65) Prior Publication Data

US 2015/0062974 A1    Mar. 5, 2015

(51) Int. Cl.
| | | |
|---|---|---|
| H02J 7/00 | (2006.01) | |
| H02M 1/32 | (2007.01) | |
| G01R 19/175 | (2006.01) | |
| H02M 1/00 | (2006.01) | |
| G01R 19/14 | (2006.01) | |

(52) U.S. Cl.
CPC .............. *H02M 1/32* (2013.01); *G01R 19/175* (2013.01); *G01R 19/14* (2013.01); *H02M 2001/0006* (2013.01); *H02M 2001/322* (2013.01)

(58) Field of Classification Search
CPC ..... G01R 19/14; G01R 19/175; H02M 1/32; H02M 2001/0006; H02M 2001/322
USPC ....................................... 320/135; 363/21.04
See application file for complete search history.

(56) References Cited

U.S. PATENT DOCUMENTS

| 3,740,581 A | 6/1973 | Pfiffner |
|---|---|---|
| 4,777,580 A | 10/1988 | Bingham |
| 4,866,585 A | 9/1989 | Das |
| 4,871,686 A | 10/1989 | Davies |

(Continued)

FOREIGN PATENT DOCUMENTS

| CN | 1492509 | 4/2004 |
|---|---|---|
| CN | 101268605 | 9/2008 |

(Continued)

OTHER PUBLICATIONS

Popa et al., "Optimal Curvature-Compensated BiCMOS Bandgap Reference". Image and Signal Processing and Analysis, 2001, pp. 507-510, Fig. 2.

(Continued)

*Primary Examiner* — Richard Isla Rodas
*Assistant Examiner* — Nathaniel Pelton
(74) *Attorney, Agent, or Firm* — The Law Offices of Bradley J. Bereznak

(57) ABSTRACT

An integrated circuit (IC) for controlling the discharge of a capacitor coupled across first and second input terminals of a power converter circuit, wherein the first and second terminals for receiving an ac line voltage. The IC includes a switching element coupled across the first and second input terminals and a detector circuit. The detector circuit including first and second comparators that produce first and second output signals responsive to a zero-crossing event of the ac line voltage. The first and second output signals being used to generate a reset signal coupled to a timer circuit responsive to the zero-crossing event. When the reset signal is not received within a delay time period, the timer circuit outputs a discharge signal that turns the switching element on, thereby discharging the capacitor.

11 Claims, 5 Drawing Sheets

(56) References Cited

U.S. PATENT DOCUMENTS

| | | |
|---|---|---|
| 4,875,151 A | 10/1989 | Ellsworth et al. |
| 4,972,237 A | 11/1990 | Kawai |
| 4,982,260 A | 1/1991 | Chang et al. |
| 5,008,794 A | 4/1991 | Leman |
| 5,072,268 A | 12/1991 | Rumennik |
| 5,164,891 A | 11/1992 | Keller |
| 5,258,636 A | 11/1993 | Rumennik et al. |
| 5,274,259 A | 12/1993 | Grabowski et al. |
| 5,282,107 A | 1/1994 | Balakrishnan |
| 5,285,367 A | 2/1994 | Keller |
| 5,313,082 A | 5/1994 | Eklund |
| 5,323,044 A | 6/1994 | Rumennik et al. |
| 5,411,901 A | 5/1995 | Grabowski et al. |
| 5,510,972 A | 4/1996 | Wong |
| 5,612,567 A | 3/1997 | Baliga |
| 5,850,337 A | 12/1998 | Lee |
| 5,969,566 A | 10/1999 | Weber et al. |
| 6,084,277 A | 7/2000 | Disney et al. |
| 6,150,871 A | 11/2000 | Yee |
| 6,157,049 A | 12/2000 | Mitlehner et al. |
| 6,168,983 B1 | 1/2001 | Rumennik et al. |
| 6,207,994 B1 | 3/2001 | Rumennik et al. |
| 6,252,288 B1 | 6/2001 | Chang |
| 6,366,485 B1 | 4/2002 | Fujisawa |
| 6,424,007 B1 | 7/2002 | Disney |
| 6,445,600 B2 | 9/2002 | Ben-Yaakov |
| 6,465,291 B1 | 10/2002 | Disney |
| 6,468,847 B1 | 10/2002 | Disney |
| 6,489,190 B2 | 12/2002 | Disney |
| 6,501,130 B2 | 12/2002 | Disney |
| 6,504,209 B2 | 1/2003 | Disney |
| 6,509,220 B2 | 1/2003 | Disney |
| 6,549,439 B1 | 4/2003 | Yu |
| 6,552,597 B1 | 4/2003 | Disney |
| 6,555,873 B2 | 4/2003 | Disney et al. |
| 6,555,883 B1 | 4/2003 | Disney et al. |
| 6,563,171 B2 | 5/2003 | Disney |
| 6,570,219 B1 | 5/2003 | Rumennik et al. |
| 6,573,558 B2 | 6/2003 | Disney |
| 6,577,512 B2 | 6/2003 | Tripathi et al. |
| 6,583,663 B1 | 6/2003 | Disney |
| 6,633,065 B2 | 10/2003 | Rumennik et al. |
| 6,635,544 B2 | 10/2003 | Disney |
| 6,639,277 B2 | 10/2003 | Rumennik et al. |
| 6,661,276 B1 | 12/2003 | Chang |
| 6,667,213 B2 | 12/2003 | Disney |
| 6,680,646 B2 | 1/2004 | Disney |
| 6,724,041 B2 | 4/2004 | Rumennik et al. |
| 6,724,244 B2 | 4/2004 | Wu |
| 6,730,585 B2 | 5/2004 | Disney |
| 6,734,461 B1 | 5/2004 | Shiomi et al. |
| 6,734,714 B2 | 5/2004 | Disney |
| 6,750,105 B2 | 6/2004 | Disney |
| 6,759,289 B2 | 7/2004 | Disney |
| 6,768,171 B2 | 7/2004 | Disney |
| 6,768,172 B2 | 7/2004 | Rumennik et al. |
| 6,777,749 B2 | 8/2004 | Rumennik et al. |
| 6,781,198 B2 | 8/2004 | Disney |
| 6,787,437 B2 | 9/2004 | Rumennik et al. |
| 6,787,847 B2 | 9/2004 | Disney et al. |
| 6,798,020 B2 | 9/2004 | Disney et al. |
| 6,800,903 B2 | 10/2004 | Rumennik et al. |
| 6,815,293 B2 | 11/2004 | Disney et al. |
| 6,818,490 B2 | 11/2004 | Disney |
| 6,825,536 B2 | 11/2004 | Disney |
| 6,828,631 B2 | 12/2004 | Rumennik et al. |
| 6,838,346 B2 | 1/2005 | Disney |
| 6,865,093 B2 | 3/2005 | Disney |
| 6,882,005 B2 | 4/2005 | Disney et al. |
| 6,933,769 B2 | 8/2005 | Koelling |
| 6,987,299 B2 | 1/2006 | Disney et al. |
| 7,092,268 B2 | 8/2006 | George |
| 7,115,958 B2 | 10/2006 | Disney et al. |
| 7,135,748 B2 | 11/2006 | Balakrishnan |
| 7,193,402 B2 | 3/2007 | Lee et al. |
| 7,220,629 B2 | 5/2007 | Balakrishnan |
| 7,221,011 B2 | 5/2007 | Banerjee et al. |
| 7,233,191 B2 | 6/2007 | Wang et al. |
| 7,253,042 B2 | 8/2007 | Disney |
| 7,253,059 B2 | 8/2007 | Balakrishnan |
| 7,295,451 B2 | 11/2007 | Charles |
| 7,301,389 B2 | 11/2007 | Coady |
| 7,335,944 B2 | 2/2008 | Banerjee |
| 7,348,830 B2 | 3/2008 | Debroux |
| 7,381,618 B2 | 6/2008 | Disney |
| 7,391,088 B2 | 6/2008 | Balakrishnan |
| 7,408,796 B2 | 8/2008 | Soldano |
| 7,459,366 B2 | 12/2008 | Banerjee |
| 7,468,536 B2 | 12/2008 | Parthasarathy |
| 7,494,875 B2 | 2/2009 | Disney |
| 7,557,406 B2 | 7/2009 | Parthasarathy |
| 7,585,719 B2 | 9/2009 | Balakrishnan |
| 7,595,523 B2 | 9/2009 | Parthasarathy et al. |
| 7,616,050 B2 | 11/2009 | Eckstein |
| 7,696,598 B2 | 4/2010 | Francis et al. |
| 7,741,788 B2 | 6/2010 | Ito et al. |
| 7,746,156 B1 | 6/2010 | Massie et al. |
| 7,760,524 B2 | 7/2010 | Matthews |
| 7,893,754 B1 | 2/2011 | Kung |
| 7,999,606 B2 | 8/2011 | Kung et al. |
| 8,115,457 B2 | 2/2012 | Balakrishnan et al. |
| 8,125,265 B2 | 2/2012 | Kung et al. |
| 8,278,994 B2 | 10/2012 | Kung et al. |
| 8,300,440 B2 | 10/2012 | Ho et al. |
| 8,373,356 B2 | 2/2013 | Shao et al. |
| 9,148,929 B2 | 9/2015 | Jiang et al. |
| 2001/0043480 A1 | 11/2001 | Shona |
| 2002/0125541 A1 | 9/2002 | Korec et al. |
| 2003/0201821 A1 | 10/2003 | Coady |
| 2004/0041622 A1 | 3/2004 | Wu |
| 2004/0061454 A1 | 4/2004 | Prasad |
| 2004/0109335 A1 | 6/2004 | Gan et al. |
| 2005/0035371 A1 | 2/2005 | Fujihira |
| 2005/0167749 A1 | 8/2005 | Disney |
| 2005/0212583 A1 | 9/2005 | Pai |
| 2005/0230745 A1 | 10/2005 | Fatemizadeh et al. |
| 2005/0242411 A1 | 11/2005 | Tso |
| 2006/0028779 A1 | 2/2006 | Bax et al. |
| 2007/0035286 A1 | 2/2007 | Lee et al. |
| 2007/0146020 A1 | 6/2007 | Williams |
| 2007/0211504 A1 | 9/2007 | Unkrich |
| 2008/0018261 A1 | 1/2008 | Kastner |
| 2008/0136350 A1 | 6/2008 | Tripathi et al. |
| 2008/0259653 A1 | 10/2008 | Baurle et al. |
| 2009/0016090 A1 | 1/2009 | Knight |
| 2009/0040795 A1 | 2/2009 | Park et al. |
| 2009/0120200 A1 | 5/2009 | Chakrabartty |
| 2009/0261790 A1 | 10/2009 | Arduini |
| 2010/0109561 A1 | 5/2010 | Chen et al. |
| 2010/0194445 A1 | 8/2010 | Balakrishnan et al. |
| 2011/0025278 A1* | 2/2011 | Balakrishnan .......... H02M 1/32 320/166 |
| 2011/0149615 A1 | 6/2011 | Matthews |
| 2012/0028083 A1 | 2/2012 | Jung |
| 2012/0074896 A1* | 3/2012 | Lui ................ H01L 27/0617 320/107 |
| 2013/0020964 A1 | 1/2013 | Nuhfer et al. |
| 2014/0340065 A1* | 11/2014 | Svorc ................. H02M 3/1588 323/284 |

FOREIGN PATENT DOCUMENTS

| | | |
|---|---|---|
| EP | 0975024 | 1/2000 |
| JP | S56037683 | 9/1982 |
| JP | H07254718 | 10/1995 |
| JP | 2003142698 | 5/2003 |

OTHER PUBLICATIONS

Maleis: "Full-Wave Rectifier for CMOS IC chip". Reg. No. H64, May 6, 1986.

* cited by examiner

CONTROLLER IC WITH ZERO-CROSSING DETECTOR AND CAPACITOR DISCHARGE SWITCHING ELEMENT

RELATED APPLICATIONS

The present application is related to application Ser. No. 12/533,977, now U.S. Pat. No. 8,115,457 (the "'457" patent), filed Jul. 31, 2009, entitled, "Method and Apparatus for Implementing a Power Converter Input Terminal Voltage discharge circuit", which is assigned to the assignee of the present application, and which application is herein incorporated in its entirety by reference.

TECHNICAL FIELD

The present disclosure generally relates to the field of integrated circuits, and more particularly to an integrated circuit for monitoring an alternating current (ac) line polarity and detecting a zero (0 V) crossing.

BACKGROUND

Integrated circuits that include high-voltage transistor switches, for example, field-effect transistor (HVFET) structures are commonly utilized for a multitude of purposes and applications. In some instances an HVFET is used in a circuit for discharging an electromagnetic interference (EMI) filter capacitor, referred to as an x-capacitor. The x-capacitor is typically coupled directly across the input terminals of a power converter circuit. In one example, a discharge circuit including one or more HVFETs may be coupled across an x-capacitor at the input terminals of a power converter. The discharge circuit may detect whether an ac electrical energy source is coupled to the input terminals of the power converter. If the ac electrical energy source is disconnected, the timing and control circuit drives the HVFET(s) on, thereby providing a path to ground such that the x-capacitor may discharge quickly.

In another example, a discharge load (i.e., one or more series resistors) is coupled across the capacitor to discharge the charge on the x-capacitor and thus drops the voltage across the input terminals within the specified time. However, using a discharge load results in substantial losses due to power dissipation when the power supply is connected to the ac electrical energy source during operation. Since power dissipation with a discharge load is substantially constant and independent of load conditions, during no/light load conditions the power dissipation may be a larger percentage of the output power, which may reduce power converter efficiency during light/no load operation; however, efficiency may be improved at higher load levels.

The use of an active switching element coupled in series with the dissipative resistors is one solution taught in the '457 patent. When the switching element is off, power is not being dissipated in the discharge load, but when the ac line voltage is removed and the x-capacitor needs to be discharged, the switching element turns on and connects the discharge load across the x-capacitor, thus discharging the x-capacitor within the specified time. One critical aspect that arises in the use of an active switching element is promptly and correctly determining when the input terminals have been decoupled or disconnected from the ac input line voltage.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DESCRIPTION OF EXAMPLE EMBODIMENTS

Figure 1:
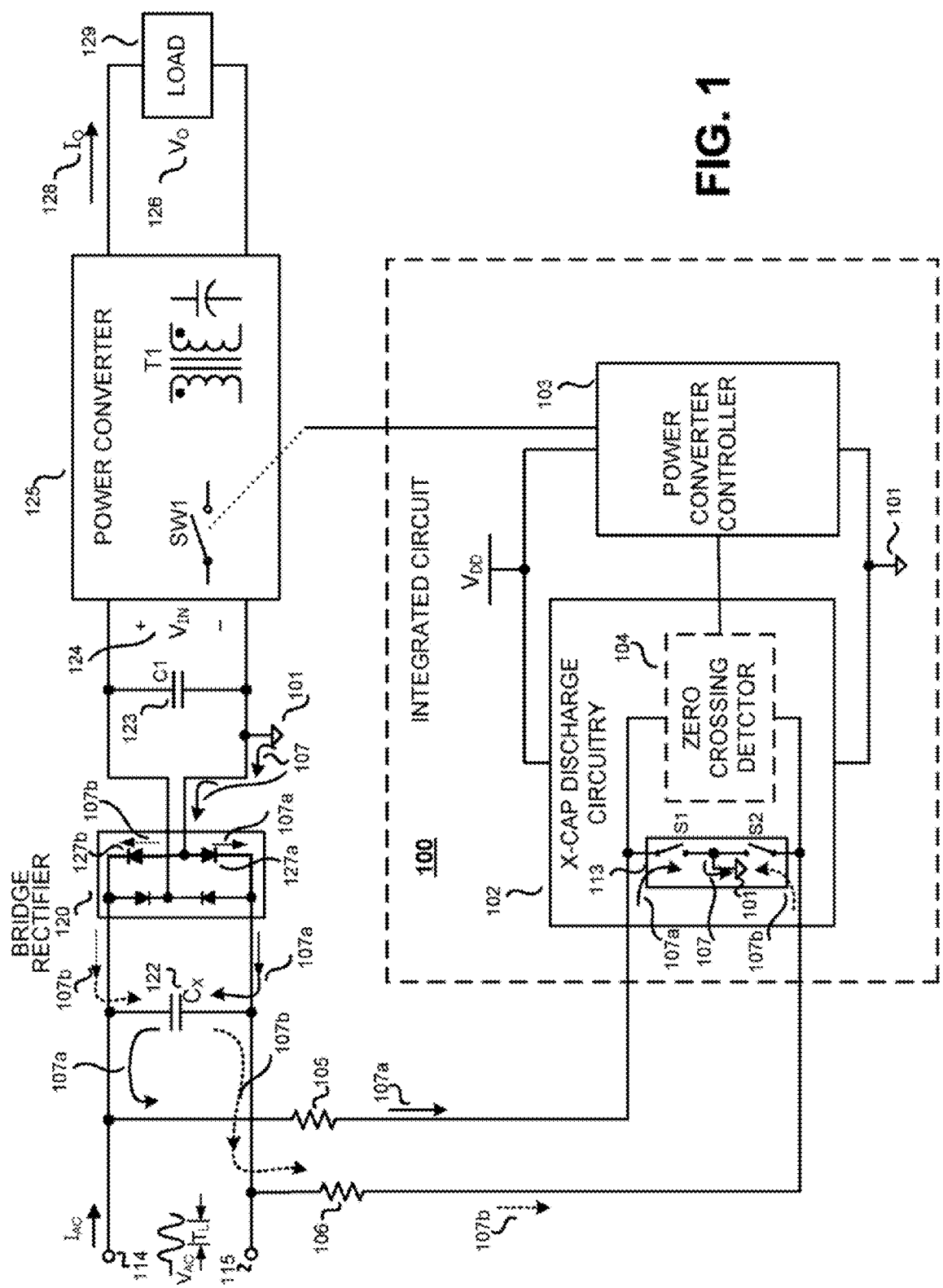
FIG. 1 illustrates an example block diagram of an off-line power converter and integrated circuit (IC) that includes an x-capacitor discharge circuit.

Embodiments of a zero-crossing detector circuit used to control the discharge of an x-capacitor in a power converter circuit or switch mode power supply are described herein. In the following description, numerous specific details are set forth in order to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects of the embodiments disclosed.

It should be understood that the elements in the figures are representational, and are not drawn to scale in the interest of clarity. It is also appreciated that although an IC utilizing field-effect transistor devices of a certain conductivity type (e.g. N-channel) is disclosed, other types of transistors and/or conductivity types may also be utilized in alternative embodiments. In still other embodiments, some or all of the field-effect transistor (FET) devices shown by way of example may be replaced with other appropriate types of transistors, other device structures, or device combinations that provide similar function. In the context of the present application, when a transistor switch or switching element is in an off state or "off" the transistor is unable to conduct current. Conversely, when a transistor switch or switching element is in an on state or "on", the transistor switch or switching element is able to conduct current. In one embodiment, a high-voltage transistor comprises a metal-oxide-semiconductor field-effect transistor (MOSFET) with the high-voltage being supported between the first terminal, a source, and the second terminal, a drain.

For purposes of this disclosure, "ground" or "ground potential" refers to a reference voltage or potential against which all other voltages or potentials of a circuit or IC are defined or measured.

In the context of the present application a high-voltage or power transistor is any semiconductor transistor structure that is capable of supporting approximately 50 V or more in an "off" state or condition. In one embodiment, a high-voltage transistor comprises an N-channel metal-oxide-semiconductor field-effect transistor (MOSFET) with the high-voltage being supported between the source and drain regions.

Reference throughout this specification to "one embodiment", "an embodiment", "one example" or "an example" means that a particular feature, structure or characteristic described in connection with the embodiment or example is included in at least one embodiment of the present invention.

Thus, the phrases "in one embodiment" or "in an example embodiment" in various places throughout this specification do not necessarily refer to the same embodiment. Furthermore, the particular features, structures, or characteristics may be combined in any suitable manner (e.g., combinations and/or sub-combinations) in one or more embodiments.

Furthermore, the particular features, structures or characteristics may be combined in any suitable combinations and/or sub-combinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

As shown, FIG. 1 illustrates an example block diagram of a power converter for generating a power supply output voltage ($V_O$) with a current ($I_O$) applied to a load 129. The example block diagram of FIG. 1 includes an integrated circuit (IC) 100 that receives power from power converter 125 to derive a supply voltage $V_{DD}$ for operation of circuitry internal to IC 100.

As shown, IC 100 includes a power converter controller 103 that controls power switch SW1 of power converter 125. In one example, power is delivered to load 129 via an energy transfer element T1 in response to the switching of power switch SW1. In addition, IC 100 includes x-capacitor discharge circuitry 102, which includes zero-crossing detector 104 coupled to control x-capacitor discharge switching elements S1 & S2. In this example, zero-crossing detector 104 is coupled to input terminals 114 & 115 of the power converter through resistors 105 & 106, respectively. As shown, zero-crossing detector 104 is also coupled to power converter controller 103. In one example, x-capacitor discharge circuitry 102 is integrated into the same package as power converter controller 103. This may allow for savings in additional package cost, and also resulting in less power dissipation.

As will be discussed in more detail below, zero-crossing detector 104 is used to detect zero-crossing events of the ac line voltage. A zero crossing event may be defined as each occurrence when the ac line voltage changes polarity (by crossing zero volts or reaching a near zero voltage). In other words, a zero-crossing event occurs when the input terminals 114 & 115 of the power converter (which are directly coupled to ac input line voltage) crosses 0 V, or reaches near 0 V (e.g., ~20 V or less). Persons of skill in the art appreciate that a zero crossing event may be detected at a voltage somewhat higher than, say, 20 V, depending on the internal thresholds set in zero crossing detector 104. In operation, zero-crossing detector 104 resets a timer at every zero-crossing event, thereby indicating to x-capacitor discharge circuitry 102 that the ac line voltage is still coupled across terminals 114 and 115, thereby keeping the high-voltage active switching elements S1 & S2 in an off state.

Practitioners will appreciate that detecting the zero-crossing event is useful in determining whether the ac line voltage is still coupled (direct electrical coupling) to input terminals 114 & 115. In the event that terminals 114 & 115 are disconnected from the ac line voltage $V_{AC}$, a voltage substantially greater than zero volts may be present across input terminals 114 & 115 due to the presence of x-capacitor ($C_X$) 122. In the event that a zero-crossing event is not detected by x-capacitor discharge circuitry 102 within a predetermined time period (i.e., a delay time period) greater than the ac line cycle (e.g., ~20 ms in one example), zero crossing detector 104 switches S1 & S2 to an on-state, thereby discharging x-capacitor 122 through either of resistors 105 or 106 to ground 101 and the discharge current 107a or 107b closes the loop through either of rectifier bridge diodes 127a or 127b, respectively. It is appreciated that, even though switches S1 and S2 may be bidirectional, the impedance seen through the ground 101 and either of the bridge rectifier diodes 127a or 127b is much less than the impedance value of the second discharge resistor and hence the discharge current closes the path through the common ground 101 of the controller and power converter and through either diode 127a or diode 127b of the input bridge rectifier (based on polarity of the voltage across the x-capacitor 122). Therefore, each of the required discharge resistors 105 and 106 should individually be calculated to limit the discharge current and discharge time. The discharge current path of x-capacitor 122 through switching elements S1 & S2 is indicated in the example of FIG. 1 by discharge paths 107a (solid arrow of the current path) and 107b (dotted arrow of the current path).

Continuing with the example of FIG. 1, a bridge rectifier 120 is shown coupled to receive an externally-generated ac line voltage, $V_{AC}$, applied across input terminals or pins 114 & 115. In one example, ac line voltage, $V_{AC}$, may be a conventional ac line voltage (e.g. 85 V ac-265 V ac; 50-60 Hz). As shown, bridge rectifier 120 functions to provide rectification to the ac line voltage. As discussed above, diodes 127a and 127b of the rectifier bridge 120 also contribute to close the discharge current loop of x-capacitor 122 through ground. The output of rectifier bridge 120 is smoothed by a bulk capacitor (C1) 123 to provide a substantially non-varying dc input voltage ($V_{IN}$) 124 to Power Converter 125.

Figure 2:
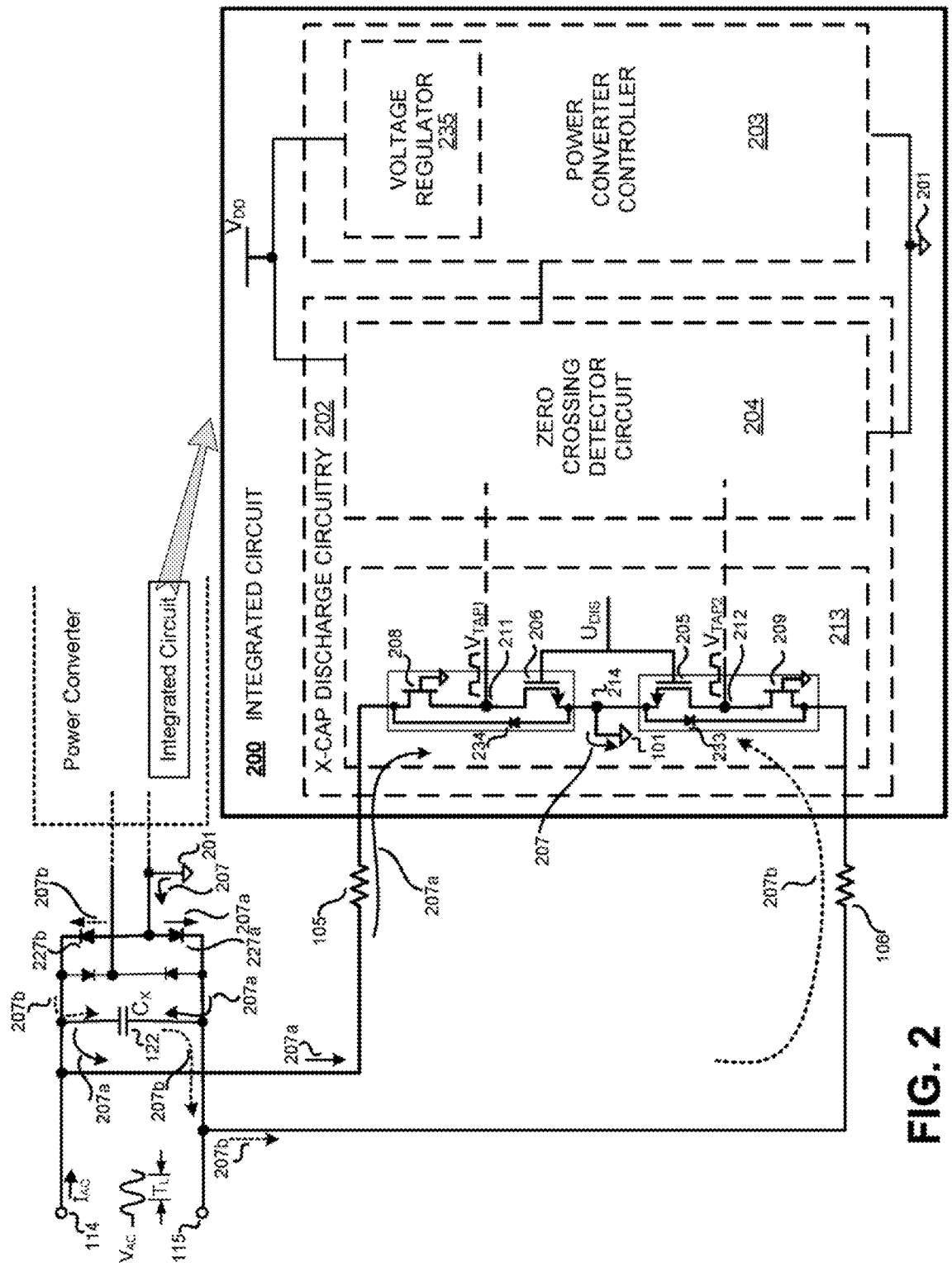
FIG. 2 illustrates an example block diagram of the IC shown in FIG. 1.

FIG. 2 illustrates x-capacitor, $C_X$, 122 coupled to input terminals 114 and 115, and coupled to a rectifier bridge at the interface of a power converter (as presented in FIG. 1) including an integrated circuit presented by an example block diagram 200, which is shown including x-capacitor discharge circuitry 202 and a power converter controller 203. Whenever the input terminals 114 and 115 are disconnected from the ac source the lack of zero-crossing signal is detected by a zero-crossing detector circuit 204 and the voltage present on x-capacitor can rapidly be discharged through either resistors 105 or 106 closing the discharge current loop through ground 201 and either rectifier bridge diode 227a or 227b. It is appreciated that even though the substrate diodes 233 and 234 are present in the switching element 213, due to much higher impedance value of the discharge resistors 105 and 106 in comparison to the impedance seen through the common ground 201 of the controller and power converter and through either diode 227a or diode 227b of the input bridge rectifier which are coupled to ground 201, the discharge current 207a or 207b (based on polarity of the voltage across the x-capacitor 122) preferably closes the loop through either of rectifier bridge diodes 227a or 227b. Therefore, the required discharge resistors 105 and 106 should be calculated individually to limit the discharge current and discharge time.

As shown, x-capacitor discharge circuitry 202 includes zero-crossing detector circuit 204, which is coupled to receive a regulated supply voltage ($V_{DD}$) from a voltage regulator 235 of power converter controller 203. Zero-crossing detector circuit 204 is also coupled to nodes 211 & 212 ($V_{TAP1}$ & $V_{TAP2}$, respectively) of x-capacitor discharge switching element 213.

As shown, a first high-voltage field-effect transistor (HVFET) 206 and a second HVFET 207 are coupled in series, with both sources connected at node 214, to provide discharge path 207a or 207b to ground. By way of example, HVFETs 206 and 205 comprise one implementation of switching element 113, as described in FIG. 1 (S1 & S2 in FIG. 1). As further shown, discharge HVFETs 206 and 205 may be further coupled in series with JFET (tap transistor) 208 and JFET (tap transistor) 209, respectively. The function of each of JFETs 208 & 209 is to limit the voltage at the respective drains of HVFETs 206 & 205 (nodes 211 & 212) to a pinch-off voltage. In one example, the pinch-off voltage of JFETs 208 & 209 is approximately 50 V.

Thus, in one embodiment switching element 213 consists of two n-channel HVFETs in series with associated JFETs. The drain of each of the HVFETs is coupled to the source of the associated series-connected JFET, wherein the tap junction between the HVFET drain and JFET source is output to zero-crossing detector circuit 204. By way of example, an n-channel HVFET coupled in series with a JFET that provides a tap junction output is disclosed in US Pat. Publ. No. 2011/0080761 A1.

As shown, zero-crossing detector circuit 204 is supplied with a $V_{DD}$ voltage provided by power converter controller 203. As shown, voltage regulator 235 is incorporated in power converter controller 203. In one example, voltage regulator 235 may be coupled to an optional bypass capacitor (not shown) to regulate an internal supply voltage for power converter controller 203 and zero crossing detector circuit 204.

Figure 3:
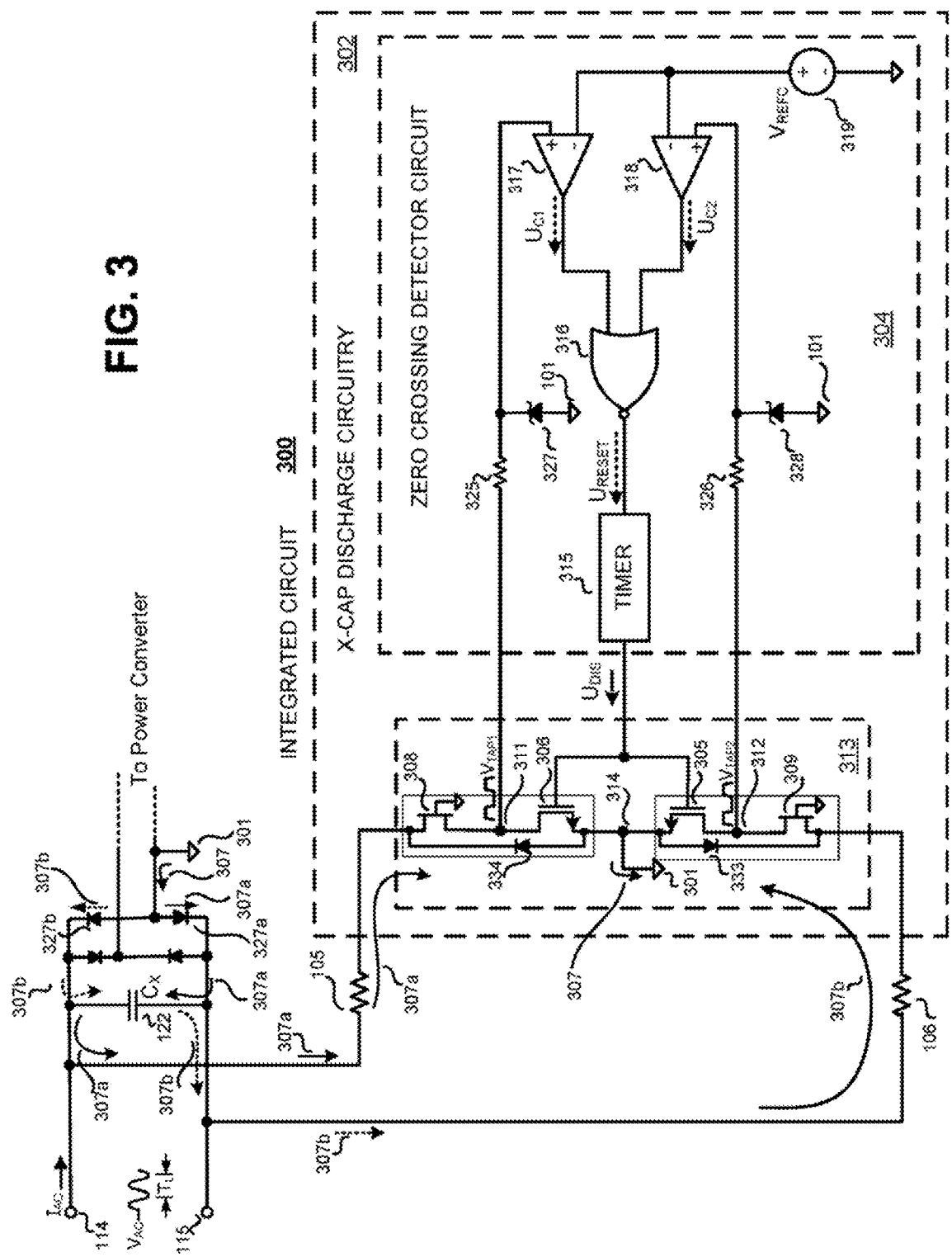
FIG. 3 illustrates an example circuit schematic diagram of an x-capacitor discharge circuit and zero-crossing detector.

FIG. 3 illustrates an example circuit schematic diagram of an x-capacitor discharge circuit 302 that, in one example, is included in IC 300 (200 in FIG. 2). X-capacitor discharge circuit 302 includes zero-crossing detector circuit 304. The example of FIG. 3 further includes x-capacitor discharge switching element 313, which comprises high-voltage transistors (HVFETs) 306 & 305, respectively coupled in series between nodes 311 and 312. The sources of HVFETs 306 & 305 are coupled to ground at node 314. In one example, nodes 311 and 312 may respectively supply a tap voltage $V_{TAP1}$ & $V_{TAP2}$ through JFETs 308 & 309.

In the example of FIG. 3, zero-crossing detector circuit 304 is shown including identical comparators 317 & 318. Comparator 317 has its positive (+) input coupled to node 311, and comparator 318 has its positive (+) input coupled to node 312. As shown, the negative (−) inputs of each of comparators 317 and 318 are compared to a reference voltage, $V_{REFC}$, provided by reference voltage source 319. In one embodiment, reference voltage $V_{REFC}$ may be generated in voltage regulator 235 (see FIG. 2). As shown, comparators 317 & 318 produce output signals $U_{C1}$ and $U_{C2}$, respectively, which are provided as inputs to a logic gate 316. Logic gate 316 produces a reset signal $U_{RESET}$ coupled as an input to timer 315. In the example shown, logic gate 316 comprises a logic NOR gate. In alternative embodiments, different types of logic gates, or combinations thereof, may be utilized to realize the same logical function. The reset signal produced by logic gate 316 resets timer 315, which is configured to responsively output discharge signal $U_{DIS}$ coupled to the gates of HVFETs 306 & 305.

In operation, output signal $U_{DIS}$ is utilized to turn on HVFETs 306 & 305 when a "no zero-crossing" event is detected across input terminals 114 & 115 over a predetermined delay time. The delay time, in one example, may be the ac line cycle period (e.g., ~20 ms). That is, comparators 317 & 318 monitor both the positive and the negative part of the ac line voltage via nodes 311 & 312, respectively. Voltage from node 311 to the comparator 317 is clamped through zener 327 and resistor 325 and voltage from node 312 to the comparator 318 is clamped through zener 328 and resistor 326. When both halves of the ac line voltage are below a certain absolute voltage level set by reference voltage $V_{REFC}$ (e.g., less than 5 V), comparators 317 & 318 produce respective output signals $U_{C1}$ and $U_{C2}$ that are both low (e.g., 0 V). When this occurs, logic gate 316 outputs a high reset signal, $U_{RESET}$, which indicates that a zero-crossing event has occurred.

Reset signal, $U_{RESET}$, output by logic gate 316 is utilized to reset timer 315. A new delay time period begins each time that timer 315 is reset by reset signal $U_{RESET}$ pulsing high. In one example, the pulse width of reset signal $U_{RESET}$ is determined by the reference voltage $V_{REFC}$ and input to comparators 317 & 318. In this manner during normal operation, with the power converter coupled to receive the ac line voltage $V_{AC}$, reset signal $U_{RESET}$ pulses high at each zero-crossing event. That is, during normal operation, i.e., when power converter is not decoupled from the ac line voltage, timer 315 is reset every ½ line cycle, which is within a predetermined delay time period, for example ~20 ms.

During operation, when the power converter is decoupled from the ac line voltage $V_{AC}$, a zero-crossing event will not be detected during the delay time period. When this happens, timer 315 outputs discharge signal $U_{DIS}$ (high) which activates x-capacitor discharge switching element 313, thereby discharging x-capacitor $C_X$ to ground potential at node 314. More specifically, discharge signal $U_{DIS}$ transitions high when a zero-crossing event has not been detected within the delay time period, which turns on HVFETS 306 & 305, thereby allowing the voltage present on x-capacitor to rapidly discharge through resistors 105 and/or 106 closing the discharge current loop through ground 301 and either rectifier bridge diode 327a or 327b. On the other hand, when timer 315 is reset (via reset signal $U_{RESET}$) within the delay time period, discharge signal $U_{DIS}$ remains low, thereby maintaining HVFETs 306 & 305 in an off state.

To reiterate, when comparators 317 & 318 both output a logical low signal, which happens as a consequence of a zero-crossing event being detected, logic gate 316 outputs reset signal $U_{RESET}$, which resets timer circuit 315. In the event that reset signal $U_{RESET}$ is not received by timer 315 in a predetermined amount of time (i.e., the delay time period), timer 315 responds by outputting discharge signal $U_{DIS}$, which, in turn, activates x-capacitor discharge switching element 313 (S1 & S2 in FIG. 1, or switching element 213 in FIG. 2), thereby rapidly discharging x-capacitor 122. In this manner, the x-capacitor discharge switching element 313 selectively discharges the x-capacitor 122 without continuously dissipating power through discharge resistors 105 & 106.

Figure 4:
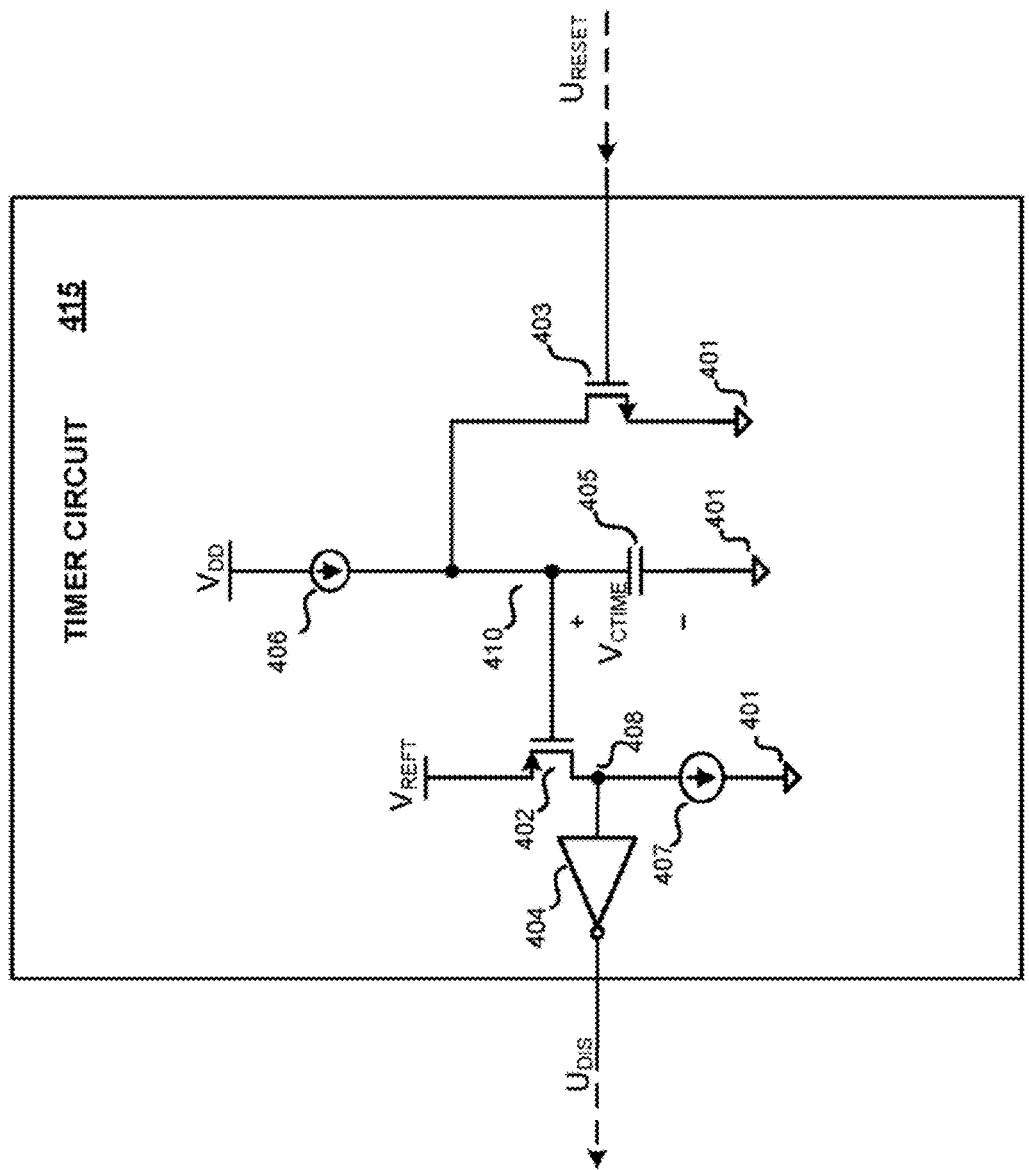
FIG. 4 illustrates an example circuit schematic diagram of a timer circuit for producing a discharge signal.

FIG. 4 illustrates an example timer circuit 415 for producing a discharge signal. $U_{DIS}$, in response to a zero-crossing event not being detected within the delay time period. Timer circuit 415 includes a transistor 403 shown coupled between node 410 and ground 401. The gate of transistor 403 is coupled to receive reset signal $U_{RESET}$. The drain of transistor 403 is coupled to the gate of transistor 402 at node 410. As shown, the source of transistor 403 is coupled to ground potential. The drain of PMOS transistor 402 is coupled to ground through current source 407. The source of transistor 402 is coupled to reference voltage $V_{REFT}$. Supply voltage $V_{DD}$ is coupled to node 410 through current source 406. Discharge signal $U_{DIS}$ is generated by inverting the signal at node 408 (through inverter 404). A timing capacitor 405 is coupled between node 410 and ground 401. The voltage appearing across timing capacitor 405, $V_{CTIME}$, controls discharge signal $U_{DIS}$ by turning transistor 402 on & off.

When reset signal $U_{RESET}$ is low (ac line voltage greater than voltage reference $V_{REFC}$), transistor 403 is off and capacitor 405 is charged by current source 406 at node 410. In operation, transistor 402 turns off when the voltage $V_{CTIME}$ across timing capacitor 405, in one example, reaches approximately ($V_{REFT}$–1V), wherein the subtracted 1 V may represent the threshold of PMOS transistor 402. When transistor 402 is off, the voltage at node 408 is pulled down to ground and the discharge signal $U_{DIS}$ at the output of inverter 404 is pulled high. In this manner, discharge signal. $U_{DIS}$ is pulled high when reset signal $U_{RESET}$ is not received at the gate of transistor 403 before the voltage across timing capacitor 405 is charged to approximately ($V_{REFT}$–1V), i.e., the end of the delay time period.

In one embodiment, the delay time of timer circuit 415 may be set by current source 406 and capacitance of timing capacitor 405. When reset signal $U_{RESET}$ is high, indicating that a zero crossing of the ac line voltage $V_{AC}$ has been detected, transistor 403 turns on, which discharges capacitor 405, thereby maintaining transistor 402 in an on state. If reset signal $U_{RESET}$ is not triggered high within the delay time period, the voltage at gate of transistor 402 will continue to rise until transistor 402 switches to an off state, which, in turn, causes the voltage at node 408 being pulled to ground and discharge signal $U_{DIS}$ being set to a high logic state. Discharge signal $U_{DIS}$ set high indicates to the discharge circuitry that the x-capacitor 122 should be discharged. In this manner, the x-capacitor discharge switching element selectively discharges x-capacitor 122 in response to discharge signal $U_{DIS}$ transitioning high.

Figure 5:
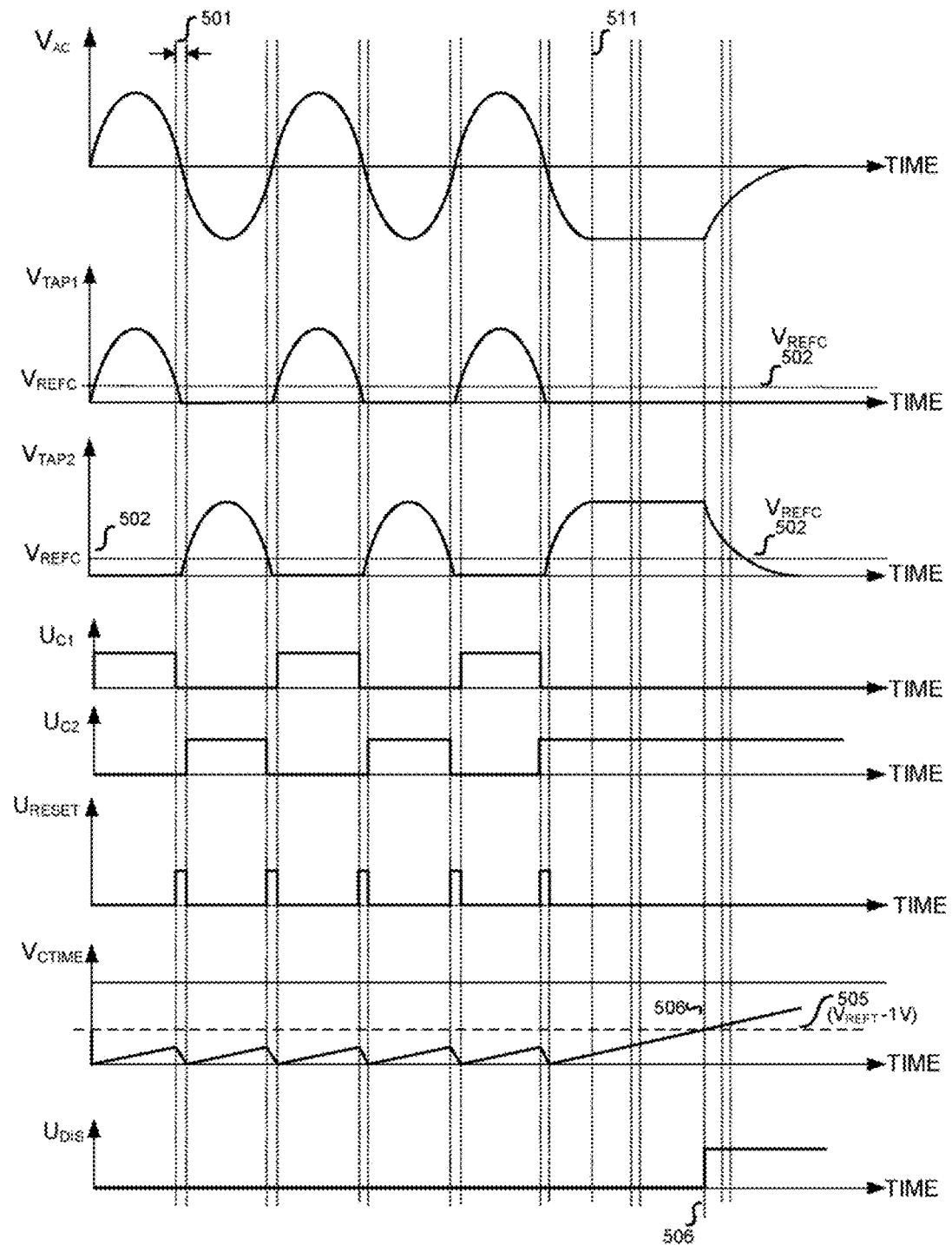
FIG. 5 is an example timing diagram that shows example waveforms during the operation of the circuitry illustrated in FIGS. 3 & 4.

FIG. 5 is an example timing diagram that shows example waveforms during the operation of the circuitry illustrated in FIGS. 3 & 4. Note that reset signal $U_{RESET}$ pulses are high briefly in response to each zero-crossing event of ac line voltage $V_{AC}$ (when absolute value of $V_{AC}$ is below a threshold voltage level $V_{REFC}$ 502). For example, in the brief time window 501 the voltages $V_{TAP1}$ & $V_{TAP2}$ (nodes 311 & 312 in FIG. 3) are both below threshold voltage level 502. As explained previously, this zero-crossing event causes comparators 317 & 318 to output signals $U_{C1}$ and $U_{C2}$ low. With both output signals $U_{C1}$ and $U_{C2}$ low, the reset signal $U_{RESET}$ pulses high. Note that during each time window 501 when $U_{RESET}$ is high, the timing capacitor voltage $V_{CTIME}$ discharges towards a low voltage level. On the other hand, when $U_{RESET}$ is low, the timing capacitor voltage $V_{CTIME}$ rises high but as long as it doesn't reach to approximately "$V_{REFT}$–1V" (the 1 V subtraction representing the threshold voltage of the P-MOS transistor 402) the P-MOS (P-channel) transistor 402 remains in on-state, and node 408 is pulled high to $V_{REFT}$. Thereby, discharge signal $U_{DIS}$ at output of inverter 404 remains at a low voltage state.

At timeline 511 ac line voltage to the power converter is disconnected. When this happens, the x-capacitor $C_X$ holds the voltage at $V_{TAP1}$ (node 311) low and the voltage at $V_{TAP2}$ (node 312) high. In response, the reset signal $U_{RESET}$ stays low, which means that the transistor 403 in timer circuit 415 remains off. With transistor 403 off, the voltage $V_{CTIME}$ at node 410 continues to rise due to the charging of timing capacitor 405. When the voltage $V_{CTIME}$ at node 410 exceeds voltage level 505 ($V_{REFT}$–1V), transistor 402 turns off, which causes the voltage at node 408 be pulled down to ground and the discharge signal $U_{DIS}$ at output of inverter 404 to transition to a high state. As shown in the timing waveform example of FIG. 5, voltage $V_{CTIME}$ exceeds voltage level 505 at timeline 506, which also allows discharge signal $U_{DIS}$ to transition from low-to-high, thereby discharging the x-capacitor.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example voltages, currents, frequencies, power range values, times, etc., are provided for explanation purposes and that other values may also be employed in other embodiments and examples in accordance with the teachings of the present invention. These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

We claim:

1. An apparatus for controlling the discharge of a capacitor coupled across first and second input terminals, the first and second terminals for receiving an ac line voltage, the apparatus comprising:
    a switching element for coupling across the first and second input terminals, when activated, the switching element providing a discharge path to discharge the capacitor through first and second high-voltage field-effect transistors (HVFETs) coupled in series; and
    detector circuitry coupled to first and second nodes of the switching element for detecting a zero-crossing event of the ac line voltage, the detector circuitry outputting a discharge signal that activates the switching element when the zero crossing event is undetected within a predetermined time period, the detector circuitry including:
        first and second comparators, each having an input respectively coupled to the first and second nodes, the first and second comparators being configured to respectively produce first and second output signals responsive to the zero-crossing event;
        a logic circuit coupled to receive the first and second output signals and output a reset signal in response thereto; and
        a timer circuit having an input coupled to receive the reset signal, the timer circuit outputting the discharge signal when the reset signal is not received within the predetermined time period.

2. The apparatus of claim 1 wherein the first and second nodes of the switching element comprise the drain nodes of the first and second HVFETs, respectively.

3. The apparatus of claim 1 wherein the discharge path further includes first and second junction field-effect transistors (JFETs) respectively coupled in series with the HVFETs, the first and second JFETs limiting a maximum voltage at the first and second nodes to a pinch-off voltage.

4. The apparatus of claim 1 wherein the predetermined time period comprises a delay time period set by the charging of a timing capacitor.

5. The apparatus of claim 1 wherein the source nodes of the first and second HVFETs are both coupled to ground.

6. The apparatus of claim 1 wherein the logic circuit comprises a NOR gate having first and second inputs respectively coupled to receive the first and second output signals.

7. The apparatus of claim 1 wherein the discharge signal is coupled to the first and second high-voltage transistor switches, the first and second high-voltage transistor switches being simultaneously turned on responsive to the discharge signal.

8. A method for controlling the discharge of a capacitor coupled across first and second input terminals, the first and second terminals for receiving an ac line voltage, the method comprising:

detecting, within a delay time period, a zero-crossing event of the ac line voltage at first and second nodes of a switching element coupled across the first and second input terminals;

resetting a timer circuit within the delay time period responsive to the detecting of the zero-crossing event; wherein if the zero-crossing event is not detected within the delay time period, then outputting, by the timer circuit, a discharge signal coupled to the switching element; and activating the switching element responsive to the discharge signal, activation of the switching element creating a discharge path to discharge the capacitor, wherein the detecting comprises:

comparing voltages appearing at the first and second nodes of the switching element to a reference voltage;

producing first and second output signals responsive when the voltages at both the first and second nodes are less than the reference voltage; and logically gating the first and second output signals to produce a reset signal responsive to the zero-crossing event.

9. The method of claim 8 wherein the switching element includes first and second high-voltage field-effect transistors (HVFETs) coupled in series, the first and second HVFETs each having a gate coupled to receive the discharge signal and a source node coupled to ground, when turned on, the first and second HVFETs creating the discharge path.

10. The method of claim 8 wherein the resetting comprises discharging a timing capacitor of the timer circuit.

11. The method of claim 9 wherein the discharge path of the switching element further includes first and second junction field-effect transistors (JFETs) respectively coupled in series with the first and second HVFETs, the first and second JFETs limiting a maximum voltage at the first and second nodes to a pinch-off voltage.

* * * * *